(12) United States Patent
Chung et al.

(10) Patent No.: US 8,143,644 B2
(45) Date of Patent: Mar. 27, 2012

(54) BIPOLAR DEVICE COMPATIBLE WITH CMOS PROCESS TECHNOLOGY

(75) Inventors: Shine Chung, Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 796 days.

(21) Appl. No.: 12/256,376

(22) Filed: Oct. 22, 2008

(65) Prior Publication Data

US 2009/0294798 A1    Dec. 3, 2009

Related U.S. Application Data

(60) Provisional application No. 61/056,709, filed on May 28, 2008.

(51) Int. Cl.
*H01L 29/739* (2006.01)

(52) U.S. Cl. ........................................................ 257/133

(58) Field of Classification Search .................. 438/136, 438/137, 156, 173, 192, 206, 212, 202–208, 438/234–239, 170, 189, 309–378; 257/E27.052, 257/E27.079, E29.036–E29.038, E29.046–E29.048, 257/E29.115, E29.196, E29.211–E29.225, 257/E21.388–E21.393; 257/E21.614, E21.677, 257/135–136, 242, 329, E27.091, E27.095–E27.096, 257/E29.118, E29.274, E29.313, E29.318, 257/E29.262; 257/E27.015, E27.017, E27.03–E27.032, 257/E27.109, E29.194–E29.225, 163–166, 257/197, 205, 273, 351, 361, 378, 423; 257/427, 257/474, 477, 517, 526, 539, 544, 565–593, 257/928, E51.004, E31.069, E27.019–E27.023, 257/E27.037–E27.043, E27.053–E27.058; 257/E27.074–E27.078, E27.106, E27.149, 257/E29.03–E29.035, E29.044–E29.045, 257/E29.114, E29.124, E27.027–E29.028; 257/E29.066–E29.067, E29.194–E29.202, 257/E21.372, E21.38–E21.381, E21.608–E21.613, 257/E21.369–E21.393, E21.382–E21.385; 257/E21.608–E21.613, E29.036–E29.038, 257/E29.046–E29.048, E29.211–E29.225, 257/E21.388–E21.393, 135–136, E27.095–E27.096, 257/E21.41, E21.629, E21.643

See application file for complete search history.

(56) References Cited

U.S. PATENT DOCUMENTS

2007/0105301 A1* 5/2007 Chen et al. .................. 438/234

* cited by examiner

*Primary Examiner* — Dao H Nguyen
*Assistant Examiner* — Tram H Nguyen
(74) *Attorney, Agent, or Firm* — K&L Gates LLP

(57) ABSTRACT

A bipolar device includes: an emitter of a first polarity type constructed on a semiconductor substrate; a collector of the first polarity type constructed on the semiconductor substrate; a gate pattern in a mesh configuration defining the emitter and the collector; an intrinsic base of a second polarity type underlying the gate pattern; and an extrinsic base constructed atop the gate pattern and coupled with the intrinsic base, for functioning together with the intrinsic base as a base of the bipolar device.

20 Claims, 5 Drawing Sheets

BIPOLAR DEVICE COMPATIBLE WITH CMOS PROCESS TECHNOLOGY

This application claims priority to U.S. Provisional Application No. 61/056,709 filed May 28, 2008.

BACKGROUND

The present invention relates generally to bipolar devices, and more particularly to bipolar devices compatible with CMOS process technology, and implemented in a mesh structure to enhance the performance.

Although CMOS devices have advantages of low power consumption and high input impedance, they often need some specially designed I/O devices and circuits to protect them from high voltage signals. Those I/O devices and circuits usually require extra masks in the course of semiconductor processing. One way to simplify the semiconductor processing is to use bipolar devices as the I/O devices. The bipolar devices are able to sustain high voltages, easy to manufacture, and fully compatible with conventional CMOS process technologies. In addition, bipolar devices have many advantages over CMOS devices in designing analog circuitry. For example, bipolar devices can offer a higher current gain, lower noise, a higher driving capability, and less device mismatch than MOS devices for the same current. It would be desirable to use bipolar devices together with CMOS devices in certain circuits to achieve better and balanced performance for circuitries.

FIG. 1 illustrates a conventional PNP bipolar transistor 10 compatible with CMOS process technologies. The LOCal Oxidation of Silicon (LOCOS) isolations 11 define three active areas 12, 13 and 14 on N well 15 in a semiconductor substrate. The active areas 12 and 13 doped with P-type impurities form an emitter 16 and collector 17, respectively. The LOCOS isolation 11 between the emitter 16 and collector 17 defines an intrinsic base 18 thereunder in the N well 15. An extrinsic base 19 is electrically connected to the intrinsic base 18 via the body of the N well 15. The extrinsic base 19 is doped with N type of impurities to improve its conductivity. When the emitter 16, collector 17 and extrinsic base 19 are properly biased, carriers would flow between the emitter 16 and the collector 17 to produce amplification of currents. Such bipolar transistor can be found in U.S. Patent Application Publication No. US 2006/0197185.

The performance of the PNP bipolar transistor 10 greatly depends on the width of the intrinsic base 18 and its distance to the extrinsic base 19. Conventionally, its current gain β, about 1-5, is too small to satisfy many circuit designs. Furthermore, if a Shallow Trench Isolations (STI) instead of a LOCOS isolation is used, it is almost impossible for carriers to travel between the collector and emitter over the STI. This further degrades the bipolar transistor's performance.

FIG. 2 illustrates a layout view of a conventional bipolar device 20 proposed to address the above issues. The bipolar device 20 is constructed on an N well 22, which is implemented on a semiconductor substrate (not shown in the figure). An isolation region 24, such as LOCOS or shallow trench isolation, is formed on the N well 22 to define an active area 26. A conductive gate 28 is formed across the active area 26. P+ doped regions 30a and 30b are formed adjacent to the conductive gate 28 on the N well 22 within the isolation region 24. N+ doped regions 32a and 32b with dosage higher than that of the N well 32 are implemented partially overlapping the N well 22 underneath the conductive gate 28 at the two longitudinal ends thereof. Extrinsic base contacts 34a and 34b are constructed on the N+ doped regions 32a and 32b, respectively, and together with the N well 22 underneath the conductive gate 28 forming the base of the bipolar device 20.

In operation, one of the P+ doped regions 30a and 30b functions as an emitter and the other as a collector. The base of the bipolar device 20 is comprised of the intrinsic base, the portion of the N well 22 underneath the conductive gate 28, and the extrinsic base including both the N+ dope regions 32a and 32b. Since the N+ doped regions 32a and 32b are placed at two longitudinal ends of the conductive gate 28, the distance between the intrinsic base and the extrinsic base is shortened, and the resistance there between is reduced as opposed to that of the prior art as shown in FIG. 1. As a result, the bipolar device 20 can achieve a higher current gain, compared to about 1 to 5 produced by the conventional bipolar device shown in FIG. 1.

FIG. 3 illustrates a conventional layout view of a bipolar device array 40 disclosed in the U.S. Patent Application Publication No. US 2007/0105301. The bipolar device array 40 is constructed on an N well 44, which is implemented on a semiconductor substrate (not shown in the figure). Rows and columns of conductive gates 42a and 42b are constructed on the N well 44. The conductive gates 42a and 42b are formed together with the gates of MOS transistor on the semiconductor substrate. The conductive gates 42a include a set of parallel lines crossing another set of parallel lines designated by 42b. P+ doped regions 46 are implemented on the N well 44 in areas between the conductive gates 42a and 42b, except for the N+ doped regions 48 designated by the broken lines. The N well 44 underneath the conductive gates 42a and 42b has an N-type polarity, without being affected during the formation of the P+ doped regions 46, as the conductive gates 42a and 42b shield off the P-type ions during the ion implantation process when forming the P+ doped regions 46. Contacts 49 are constructed on the P+ doped regions 46 and the N+ doped regions 48.

Every two adjacent P+ doped regions 46 function as a collector and an emitter, respectively. The N well 44 underneath the conductive gates 42a and 42b functions as intrinsic bases, whereas the N+ doped regions 48 function as extrinsic bases. Each emitter and its surrounding collectors and bases function together as a PNP bipolar device, and rows and columns of such bipolar devices make up the bipolar device array 40. The bipolar device array 40 has the advantages of reduced base resistance and increased device layout density.

In view of the foregoing, there is still room for improvement on the architecture and the layout of the conventional bipolar devices in order to increase the current gain and the device layout density.

SUMMARY

The present invention is directed to a bipolar device. In one embodiment of the present invention, the bipolar device includes: an emitter of a first polarity type constructed on a semiconductor substrate; a collector of the first polarity type constructed on the semiconductor substrate; a gate pattern in a mesh configuration defining the emitter and the collector; an intrinsic base of a second polarity type underlying the gate pattern; and an extrinsic base constructed atop the gate pattern and coupled with the intrinsic base, for functioning together with the intrinsic base as a base of the bipolar device.

In another embodiment of the present invention, a bipolar device array is disclosed, which includes: an emitter of a first polarity type constructed on a semiconductor substrate; a collector of the first polarity type constructed on the semiconductor substrate; a gate pattern in a mesh configuration defining the emitter and the collector; an intrinsic base of a second polarity type underlying the gate pattern; an extrinsic base constructed atop the gate pattern and coupled with the intrinsic base, for functioning together with the intrinsic base as a base of the bipolar device, and an emitter contact constructed on the emitter, wherein a distance between the emitter contact and the collector is shorter than that between the emitter contact and the extrinsic base.

The construction and method of operation of the invention, however, together with additional objectives and advantages thereof will be best understood from the following description of specific embodiments when read in connection with the accompanying drawings.

DESCRIPTION

This invention describes a bipolar device array having improved current gain and compatible with CMOS processing technology. The following merely illustrates various embodiments of the present invention for purposes of explaining the principles thereof. It is understood that those skilled in the art will be able to devise various equivalents that, although not explicitly described herein, embody the principles of this invention.

Figure 1:
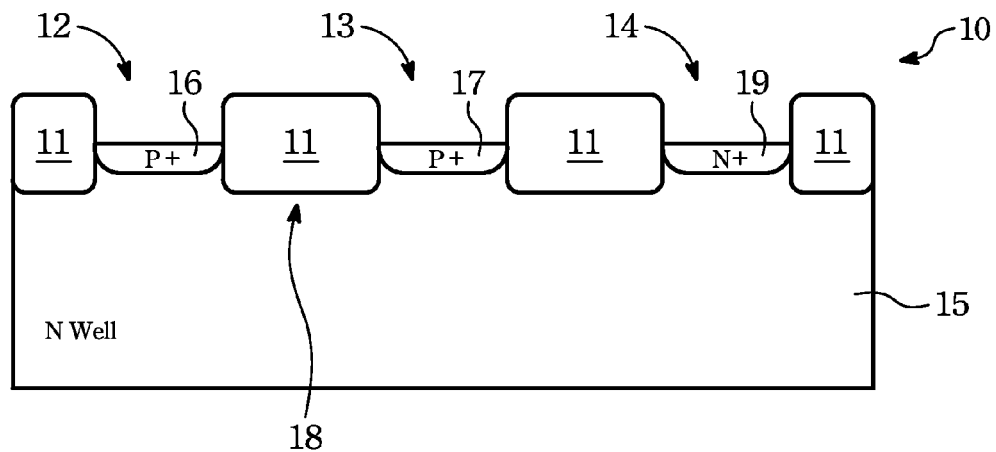
FIG. 1 illustrates a cross-sectional view of a conventional bipolar device.
Figure 2:
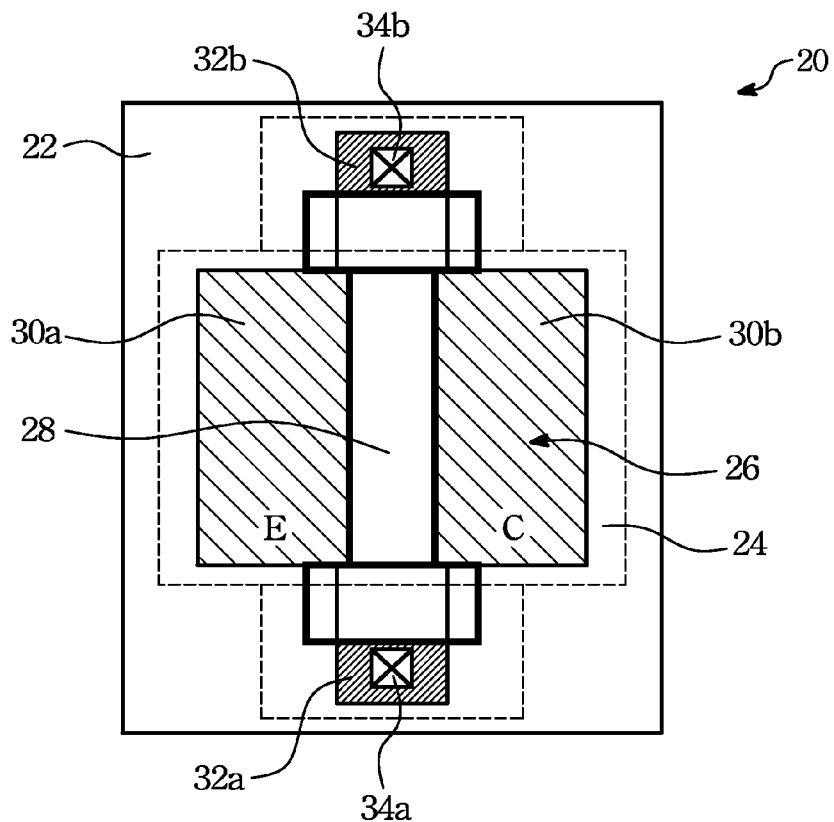
FIG. 2 illustrates a layout view of a conventional bipolar device.
Figure 3:
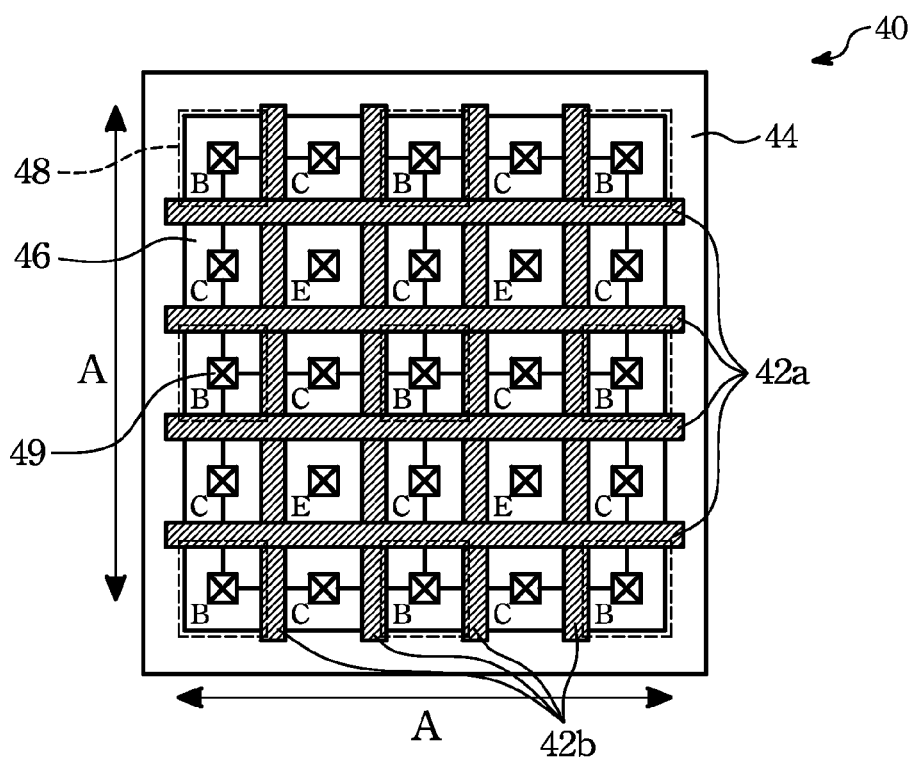
FIG. 3 illustrates a layout view of a conventional bipolar device array.
Figure 4A:
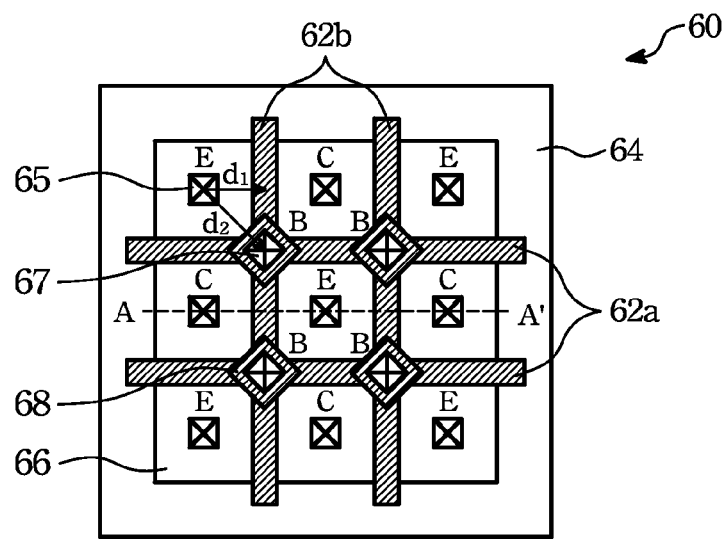
FIG. 4A illustrates a layout view of a bipolar device array in accordance with one embodiment of the present invention.

FIG. 4A illustrates a layout view of a bipolar device array 60 in accordance with one embodiment of the present invention. Rows of conductive gates 62a and columns of conductive gates 62b are disposed on an N-well 64, and define P+ doped regions 66 functioning as collectors or emitters there between. The N well 64 underneath the conductive gates 62a and 62b functions as the intrinsic bases doped with N type impurities. The extrinsic bases 68 are formed by heavily doping the cross areas of the conductive gates 62a and 62b with N-type impurities, so as to form ohmic contact with its underlying intrinsic base. Contacts 65 are constructed on the P+ doped regions 66 and contacts 67 are constructed on the extrinsic bases 68. The extrinsic base 68, the intrinsic bases underlying the conductive gates 62a and 62b, and its neighboring emitter and collector together function as a bipolar device.

Figure 4B:
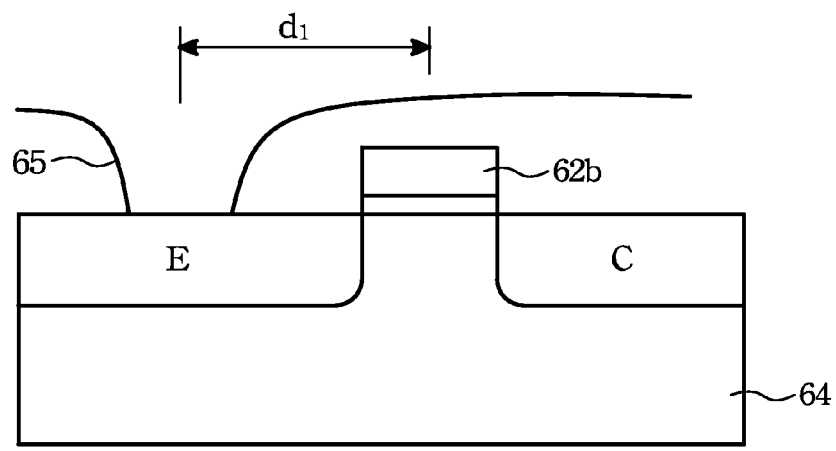
FIG. 4B illustrates a cross-sectional view of the bipolar device array in accordance with the embodiment of the present invention.
Figure 4C:
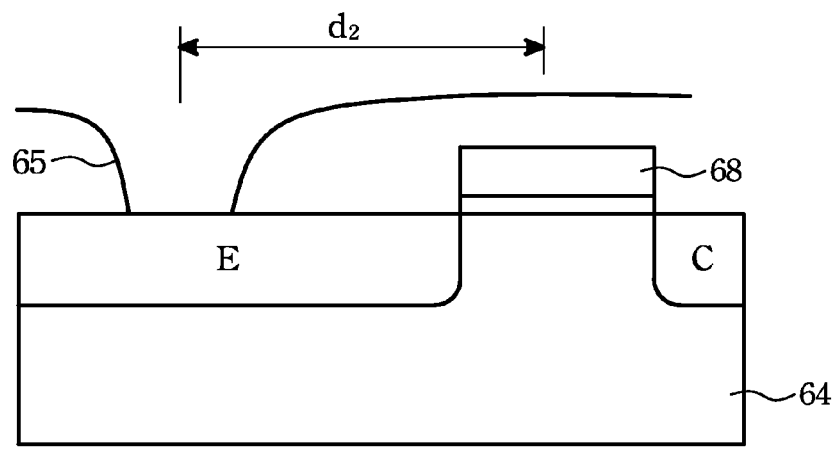
FIG. 4C illustrates a cross-sectional view of the bipolar device array in accordance with the embodiment of the present invention.

One consideration in constructing the bipolar device array 60 is that the distance d1 between the emitter and the collector should be shorter than the distance d2 between the emitter contact 65 and the extrinsic base 68. FIG. 4B illustrates a partially cross-sectional view of the bipolar device array 60 along the distance d1 between the emitter contact 65 and the collector adjacent to the conductive gate 62b, whereas FIG. 4C illustrates a partially cross-sectional view of the bipolar device array 60 along the distance d2 between the emitter contact 65 and the extrinsic base 68. As clearly shown in those figures, the distance d1 between the emitter and the collector is shorter than the distance d2 between the emitter and the extrinsic base 68. When the emitter and the base are forward biased, this configuration ensures that most of the carriers would flow between the emitter and the collector, instead of flowing directly between the emitter and the extrinsic base, thereby allowing the bipolar device to function properly.

The materials of the conductive gates 62a and 62b can be polysilicon, tungsten or other metal alloys. However, it is noted that since the conductive gates 62a ad 62b are designed as dummy structures that do not function as active parts of the bipolar device array 60, as an alternative, they can also be made of non-conductive materials, trading off the compatibility with the conventional CMOS process. The conductive gates 62a and 62b are merely used to define intrinsic base from lithography standpoint. The conductive gates may be etched away, otherwise an MOS device may be turned on when the bipolar device is active. The extrinsic base contacts needs to be ohmic, otherwise the performance of a bipolar device may be degraded substantially. As an embodiment, an ohmic contact can be formed by heavy ion implantation of such N+ dopants as phosphorus or arsenic ions after the extrinsic base contacts are opened.

The density of the bipolar devices is increased, thereby rendering more bipolar devices in a unit area of the silicon real estate. Instead of constructing the bipolar device with one elongated intrinsic base, each bipolar device in the array 60 has four intrinsic bases surrounding an emitter, such that it can be made in a more compact manner. As a result, the proposed bipolar device array can be scaled up to provide an enlarged current gain. For example, the current gain of the proposed bipolar device array can exceed 100, which is sufficient for most of the applications in circuit designs.

Figure 4D:
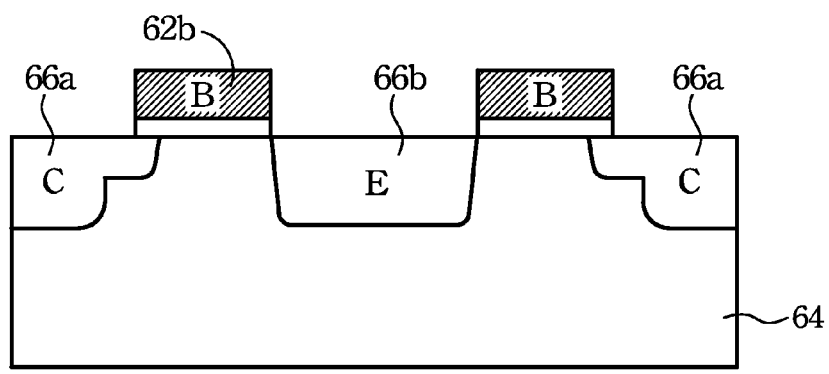
FIG. 4D illustrates a cross-sectional view of the bipolar device array in accordance with the embodiment of the present invention.

FIG. 4D illustrates a cross-sectional view of a bipolar device along the line A-A' in the array 60 shown in FIG. 4A. The collector 66a and the emitter 66b are constructed on the N well 64, and separated by the intrinsic base the area underneath the conductive gate 62b. The lightly doped drain of the emitter 66b and the pocket implants of the collector 66a and the emitter 66b are eliminated in order to increase the emitter efficiency. This architecture can be used as a basic structure to construct the bipolar device array 60 as shown in FIG. 4A, and also other various arrays that will be described in following paragraphs.

Figure 5:
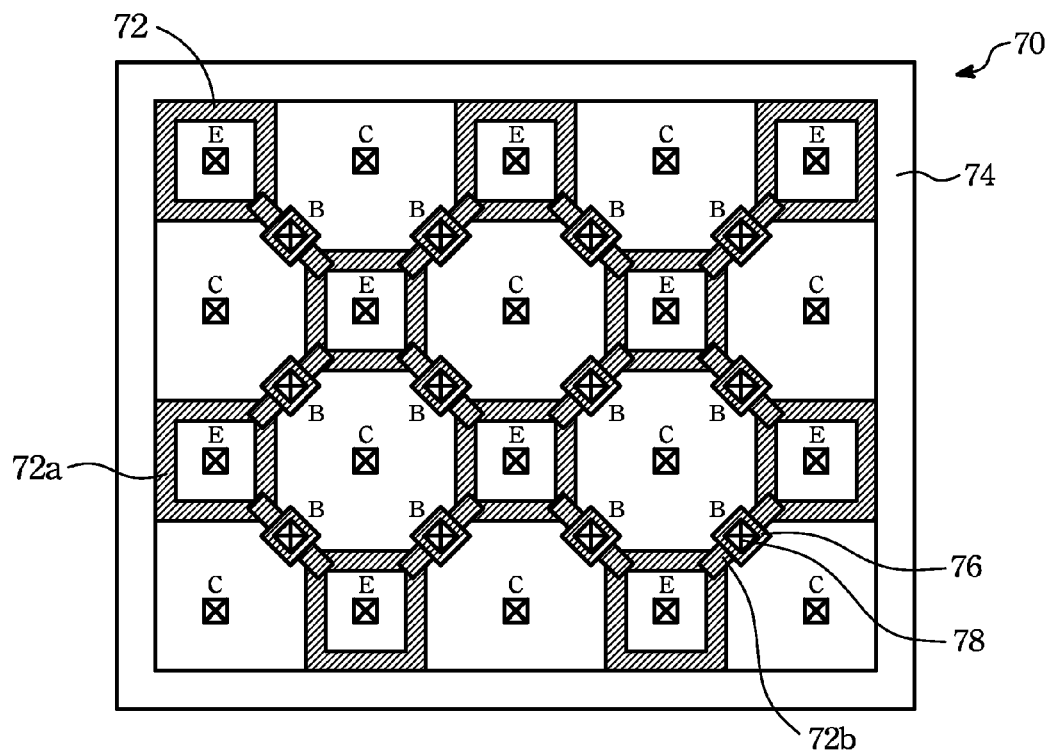
FIG. 5 illustrates a layout view of a bipolar device array in accordance with another embodiment of the present invention.

FIG. 5 illustrates a layout view of a bipolar device array 70 in accordance with another embodiment of the present invention. The bipolar device array 70 is constructed on an N well 74, which is implemented on a semiconductor substrate (not shown in the figure). Conductive gates 72 are constructed on the N well 74 in a configuration comprised of square-shaped gates 72a and bridges 72b that link the square-shaped gates 72a together. The areas within the boundary of the square-shaped gate 72a are doped with P-type impurities to form P+ doped regions functioning as emitters. The areas defined by the boundary of the square-shaped gate 72*a* and the bridges 72*b* are doped with P-type impurities to form P+ doped regions functioning as collectors. The N well 74 underneath the conductive gates 72, both the square-shaped gates 72*a* and the bridges 72*b* functions as intrinsic bases. Parts of the bridges 72*b* are doped with N type impurities to form N+ doped regions 76 functioning as extrinsic bases, on which their corresponding base contacts 78 are formed. It is noted that although a square-shaped conductive gates is disclosed, as alternatives, it can be made in any polygonal shapes or geometrical shapes.

Figure 6:
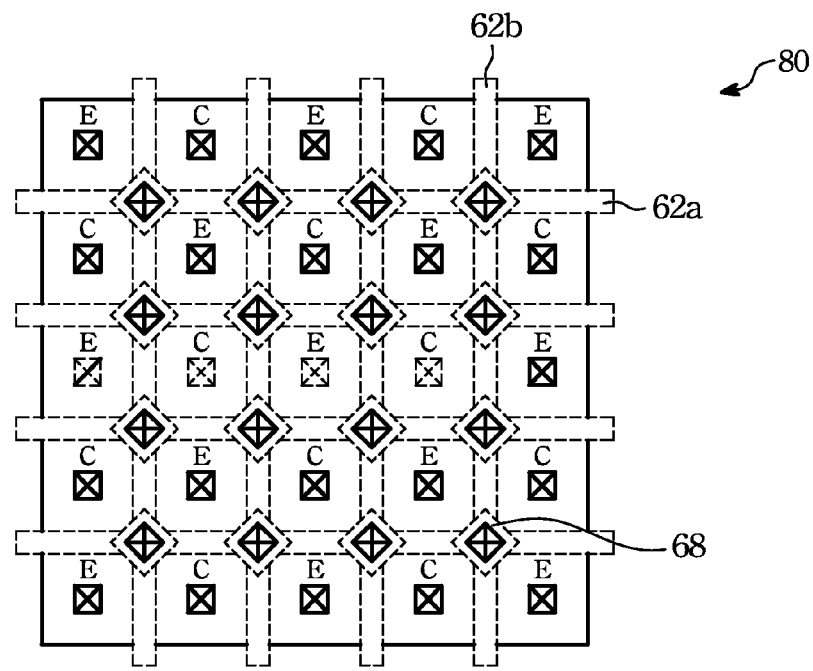
FIG. 6 illustrates a layout view of a bipolar device array in accordance with yet another embodiment of the present invention.

FIG. 6 illustrates a layout view of a bipolar device array 80 in accordance with yet another embodiment of the present invention. The bipolar device array 80 has a configuration similar to that of the array 60 shown in FIG. 4A, expect that the conductive gates 62*a* and 62*b* are removed with the extrinsic base 68 remained, as opposed to an otherwise merged MOS/bipolar device where the MOS gate and the extrinsic base are connected.

Figure 7:
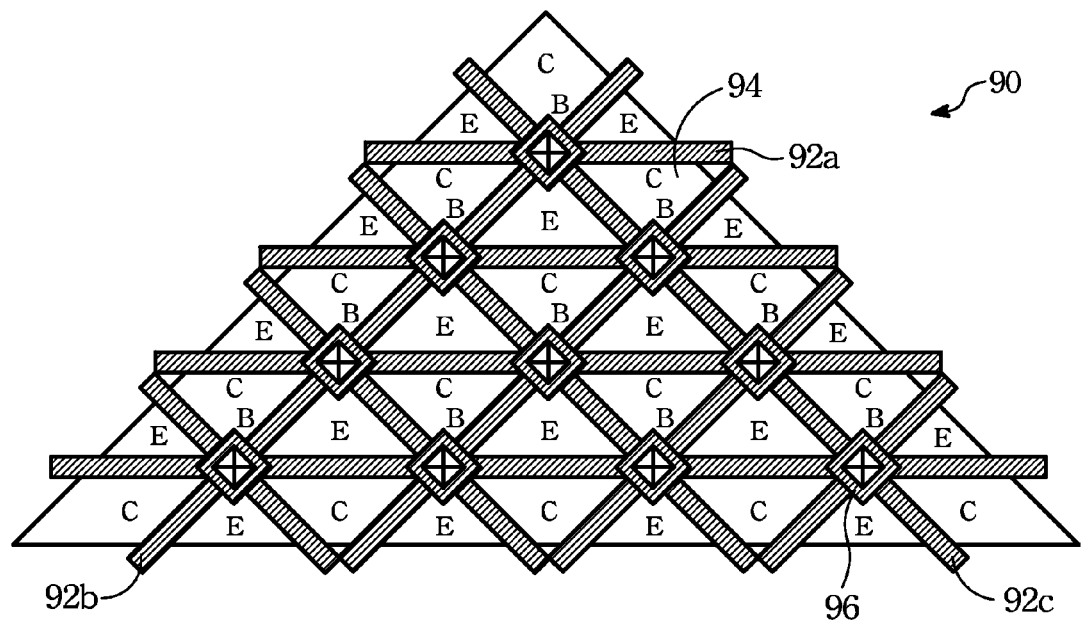
FIG. 7 illustrates a layout view of a bipolar device array in accordance with yet another embodiment of the present invention.

FIG. 7 illustrates a layout view of a bipolar device array 90 in accordance with yet another embodiment of the present invention. In the array 90, the conductive gates 92*a*, 92*b* and 92*c* are arranged in three directions representing three sides of a triangle. P+ doped regions 94 are formed within the triangular areas defined by adjacent segments of the conductive gates 92*a*, 92*b* and 92*c* to function as emitters and collectors. N+ doped regions 96 are formed at the cross points of the conductive gates 92*a*, 92*b* and 92*c* to function as extrinsic bases. Each set of neighboring emitters, collectors and extrinsic bases functions as a bipolar device within the array 90.

Figure 8:
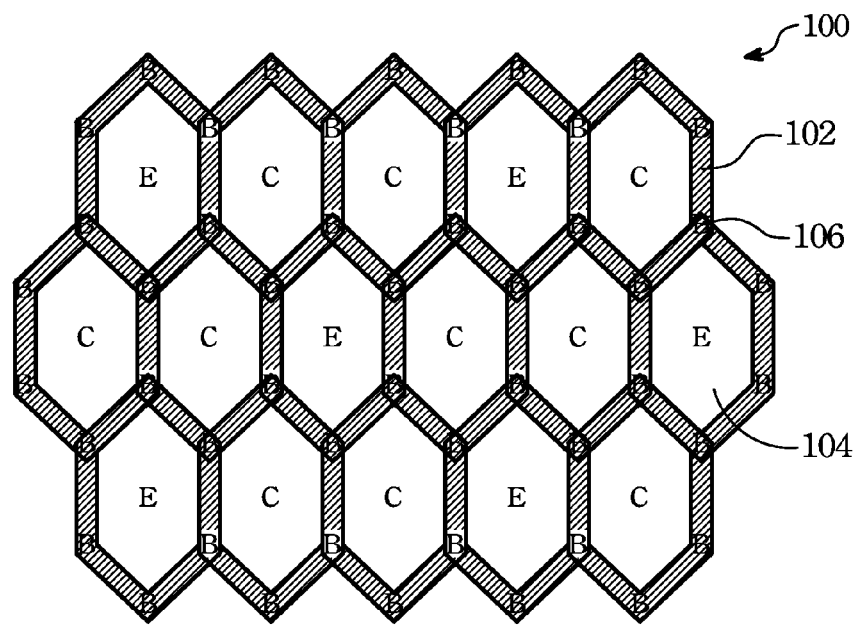
FIG. 8 illustrates a layout view of a bipolar device array in accordance with yet another embodiment of the present invention.

FIG. 8 illustrates a layout view of a bipolar device array 100 in accordance with yet another embodiment of the present invention. In the array 100, the conductive gates 102 are arranged in a hexagonal shape. P+ doped regions 104 are formed within the hexagons defined by the conductive gates 102 to function as emitters and collectors. N+ doped regions 106 are formed at the corners of the conductive gates 102 to function as extrinsic bases. Each set of neighboring emitters, collectors and extrinsic bases functions as a bipolar device within the array 100.

It is noted that the bipolar device arrays shown in FIG. 4A, FIG. 7 and FIG. 8 have a common feature in the sense that the extrinsic bases are formed at the intersections of the conductive gates, and scattered around the emitters and the collectors. This configuration allows the bipolar devices to be constructed in a compact manner, thereby increasing the device density in a unit layout area.

It is understood by people skilled in the art of semiconductor technology that although the above embodiments are directed to PNP bipolar devices, the principles explained by the above embodiment can be applied to construct NPN bipolar devices by inverting the polarity of the collector, the emitter and the base of the bipolar device.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A bipolar device comprising:
   an emitter of a first polarity type constructed on a semiconductor substrate;
   a collector of the first polarity type constructed on the semiconductor substrate;
   a gate pattern in a mesh configuration defining the emitter and the collector;
   an intrinsic base of a second polarity type underlying the gate pattern; and
   an extrinsic base constructed atop the gate pattern and coupled with the intrinsic base, for functioning together with the intrinsic base as a base of the bipolar device.

2. The bipolar device of claim 1 comprising an emitter contact constructed on the emitter.

3. The bipolar device of claim 2 wherein a distance between the emitter contact and the collector is shorter than that between the emitter contact and the extrinsic base.

4. The bipolar device of claim 1 wherein the gate pattern comprises columns of gates intersecting rows of gates.

5. The bipolar device of claim 4 wherein the extrinsic base is constructed on an intersection of the gates.

6. The bipolar device of claim 1 wherein the gate pattern comprises a plurality If polygons connected by a plurality of bridges.

7. The bipolar device of claim 6 wherein the extrinsic base is constructed on the bridge of the gate pattern.

8. The bipolar device of claim 1 wherein the gate pattern comprises a plurality of gates configuring the emitter and the collector in polygonal shapes with a number of intersections.

9. The bipolar device of claim 8 wherein the extrinsic base is formed on the intersection of the gates.

10. The bipolar device of claim 1 wherein the gate pattern comprises a plurality of discrete doped regions.

11. The bipolar device of claim 1 wherein the emitter is a doped region without a lightly doped drain (LDD) structure.

12. The bipolar device of claim 1 wherein the extrinsic base is in ohmic contact with the intrinsic base.

13. A bipolar device comprising:
   an emitter of a first polarity type constructed on a semiconductor substrate;
   a collector of the first polarity type constructed on the semiconductor substrate;
   a gate pattern in a mesh configuration defining the emitter and the collector;
   an intrinsic base of a second polarity type underlying the gate pattern;
   an extrinsic base constructed atop the gate pattern and coupled with the intrinsic base, for functioning together with the intrinsic base as a base of the bipolar device, and
   an emitter contact constructed on the emitter, wherein a distance between the emitter contact and the collector is shorter than that between the emitter contact and the extrinsic base.

14. The bipolar device of claim 13 wherein the gate pattern comprises a plurality of gates configuring the emitter and the collector in polygonal shapes with a number of intersections.

15. The bipolar device of claim 14 wherein the extrinsic base is formed on the intersection of the gates.

16. The bipolar device of claim 13 wherein the gate pattern comprises a plurality of polygons connected by a plurality of bridges.

17. The bipolar device of claim 16 wherein the extrinsic base is constructed on the bridge of the gate pattern.

18. The bipolar device of claim 13 wherein the gate pattern comprises a plurality of discrete doped regions.

19. The bipolar device of claim 13 herein the emitter is a doped region without a lightly doped drain (LDD) structure.

20. The bipolar device of claim 13 wherein the extrinsic base is in ohmic contact with the intrinsic base.

* * * * *